United States Patent [19]

Yassa et al.

[11] Patent Number: 5,181,033
[45] Date of Patent: Jan. 19, 1993

[54] DIGITAL FILTER FOR FILTERING AND DECIMATING DELTA SIGMA MODULATOR OUTPUT SIGNALS

[75] Inventors: Fathy F. Yassa, Clifton Park; Steven L. Garverick, Schenectady, both of N.Y.

[73] Assignee: General Electric Company, Schenectady, N.Y.

[21] Appl. No.: 844,032

[22] Filed: Mar. 2, 1992

[51] Int. Cl.[5] .................. H03M 3/02; G06F 15/31
[52] U.S. Cl. ........................ 341/143; 364/724.1; 364/724.04
[58] Field of Search .............. 341/143, 155, 166; 364/724.1, 724.04; 375/28-32

[56] References Cited

U.S. PATENT DOCUMENTS

| | | | |
|---|---|---|---|
| 4,520,491 | 5/1985 | Raulin et al. | 341/143 X |
| 4,694,413 | 9/1987 | Arbeiter | 364/724.1 |
| 4,851,841 | 7/1989 | Sooch | 341/143 |
| 4,893,265 | 1/1990 | Hirosaki | 364/724.1 |
| 4,937,577 | 6/1990 | Rich et al. | 341/143 |
| 4,972,357 | 11/1990 | Morel | 364/724.1 |
| 4,972,360 | 11/1990 | Cukier et al. | 341/143 X |
| 4,972,436 | 11/1990 | Halim et al. | 341/143 X |
| 4,999,625 | 3/1991 | Thompson | 341/143 X |
| 5,065,157 | 11/1991 | Ribner et al. | 341/143 |
| 5,084,702 | 1/1992 | Ribner | 341/143 |

OTHER PUBLICATIONS

J. C. Candy, "A Use of Limit Cycle Oscillators to Obtain Robust Analog to Digital Converters", IEEE Transactions on Communications, vol. COM-22, No. 3, Mar. 1974, pp. 298-305.

J. C. Candy et al., "Using Triangularly Weighted Interpolation to get 13-Bit PCM from a Sigma-Delta Modulator", IEEE Transactions on Communications, vol. COM-24, No. 11, Nov. 1976, pp. 1268-1275.

A. V. Oppenheim et al., "Digital Signal Processing", Prentice-Hall International Inc. (1975) pp. 155-165.

*Primary Examiner*—Sharon D. Logan
*Attorney, Agent, or Firm*—Marvin Snyder

[57] ABSTRACT

An oversampled interpolative delta sigma analog-to-digital converter including a delta sigma modulator is provided with a cascade of bit-slice elements at the output of the modulator to form a filter/decimator. Each bit-slice element includes a filter circuit that filters the bit-rate signal in accordance with an arbitrary filter impulse response input signal to provide the converter with a filter characteristic that can be controllably varied without modifying the filter hardware. In each bit-slice element, an adder circuit and a delay circuit decimate the bit-rate signal produced by the delta sigma modulator to provide a digital output signal at a clock cycle rate equal to the Nyquist rate. The filter/decimator also provides encoding of the delta sigma output in 2's complement format.

14 Claims, 5 Drawing Sheets

DIGITAL FILTER FOR FILTERING AND DECIMATING DELTA SIGMA MODULATOR OUTPUT SIGNALS

BACKGROUND OF THE INVENTION

1. Field of the Invention

The present invention generally relates to oversampled delta sigma ($\Delta$-$\Sigma$) modulation analog-to-digital (A/D) converters and, more particularly, to a digital filter for filtering and decimating the output signals of the $\Delta$-$\Sigma$ converter.

2. General Description of the Prior Art

With recent advances in the use of digital signal processing techniques for analog signals, many refinements in the basic and well-known process of analog-to-digital (A/D) conversion have been required. A/D converters have become very sophisticated, providing conversions at high speeds and with increasing accuracy. High resolution A/D signal conversion can be achieved with lower resolution components through the use of oversampled interpolative (or delta sigma) modulation followed by digital low pass filtering and decimation. Oversampling refers to operation of the modulator at a rate many times greater than the Nyquist rate, whereas decimation refers to reduction of the clock rate down to the Nyquist rate.

Delta sigma modulators (sometimes referred to as sigma delta modulators) have been used in A/D converters for some time. Detailed general information can be obtained from the following technical articles which are hereby incorporated by reference:

1) "A Use of Limit Cycle Oscillators to Obtain Robust Analog to Digital Converters", J. C. Candy, *IEEE Transactions on Communications*, vol. COM-22, no. 3, March 1974, pp. 298-305.
2) "Using Triangularly Weighted Interpolation to Get 13-Bit PCM from a Sigma-Delta Modulator", J. C. Candy et al., *IEEE Transactions on Communications*, vol. COM-24, no. 11, November 1976, pp. 1268-1275.

Broadly described, a delta sigma A/D converter uses an internal A/D converter of modest resolution and a complementary digital-to-analog (D/A) converter in a feedback loop. The feedback loop increases resolution of the A/D converter in a manner consistent with the high speed operation afforded by the internal A/D converter. In theory, any error in linearity caused by the D/A converter is effectively added to the input signal and appears at the output without attenuation. Hence, 1-bit A/D and D/A linear converters are commonly employed in the feedback loop. When multi-bit A/D and D/A converters are employed in the feedback loop, the overall circuit is generally referred to as an "oversampling" A/D converter.

The output signal of a delta sigma modulator is a bit-rate representation of the analog input signal. This bit-rate signal is decimated to a lower sampling rate and coded, usually in 2's complement format. The output signal of the modulator is filtered in order to remove high frequency quantization noise present in the single-bit representation of the analog input signal. Previously, the application of filter characteristics to the $\Delta$-$\Sigma$ modulator output signal bit-rate was fixed by customizing the hardware used, depending on the desired filter shape. Manufacture of a general purpose delta sigma modulator has not been demonstrated.

SUMMARY OF THE INVENTION

It is therefore an object of the present invention to provide an improved digital filter and decimator for filtering and decimating an oversampled delta sigma modulator output signal bit-rate to produce a filtered digital signal at the Nyquist rate.

Another object of the invention is to provide a filter/decimator with a filter characteristic that can be modified without modifying the filter/decimator hardware.

A further object of the invention is to provide a filter/decimator having a finite impulse response (FIR) that can be modified by supplying thereto an arbitrary binary number corresponding to the desired filter characteristic.

Yet another object of the invention is to provide a filter/decimator element in bit-slice form that allows cascading of the filter/decimator elements to any arbitrary filter length.

Another object of the invention is to provide an oversampled delta sigma modulator with a filter/decimator element that produces the delta sigma modulator output signal in 2's complement format.

Briefly, in accordance with a preferred embodiment of the invention, an improved oversampled interpolative (delta-sigma) analog-to-digital (A/D) converter comprises a delta sigma modulator and a cascade of filter/decimator bit-slice elements. The filter/decimator decimates the bit-rate signal received from the delta sigma modulator to provide a digital output signal at an input clock rate, and filters the bit-rate signal depending on an arbitrary filter impulse response input to provide variable filter characteristics without modifying the filter hardware. The invention allows the application of arbitrary filter impulse response signals and decimation with a bit-slice that provides conversion from higher sampling rates, and further allows encoding of the delta sigma output in 2's complement format. This new combination results in a general purpose high resolution A/D converter having many applications.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE PREFERRED EMBODIMENTS OF THE INVENTION

Figure 1:
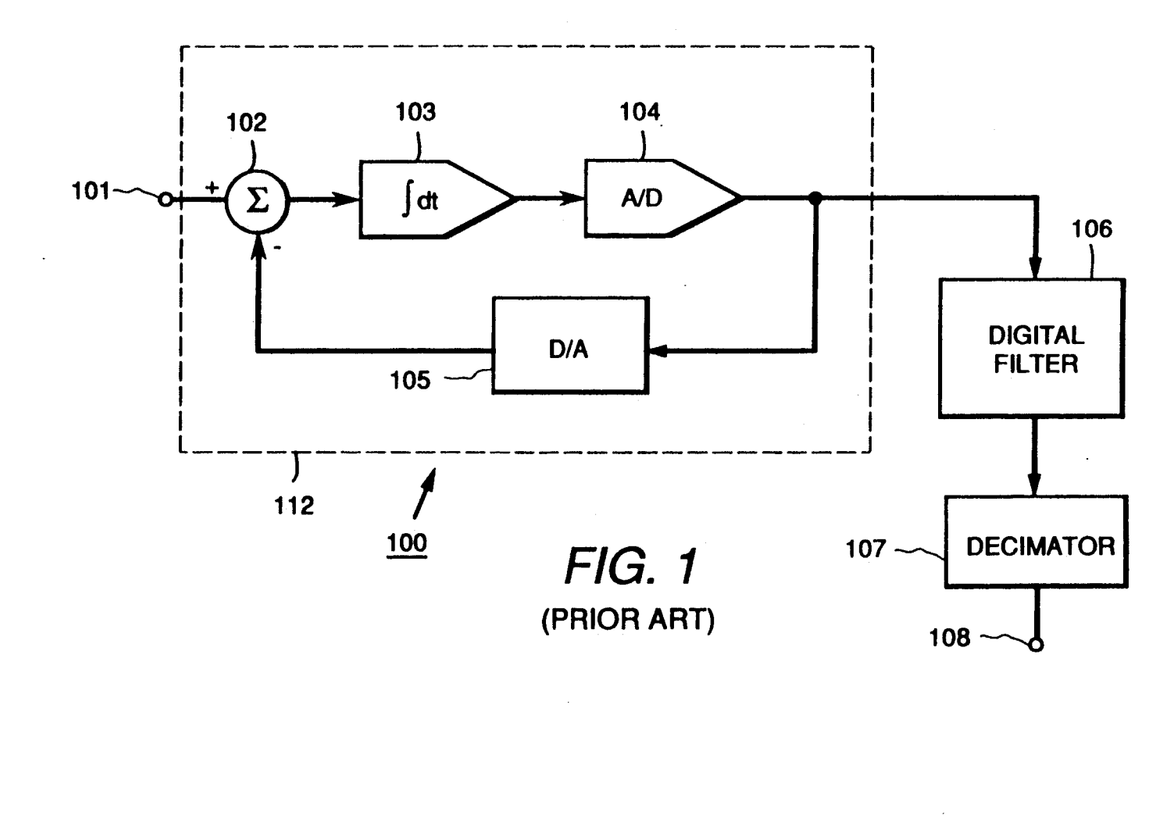
FIG. 1 is a block diagram of a conventional, first order delta sigma A/D converter.

FIG. 1 illustrates a form of A/D converter arrangement 100 known in the art, as generally discussed above. For simplicity, a first order delta sigma A/D converter arrangement 100 is shown, but it will become clear from the following discussion that a delta sigma A/D converter of any order may be used in practicing the invention. In fact, any A/D architecture can be used provided a single reference voltage defines all the quantized levels.

A/D converter arrangement 100 employs an oversampled modulator 112; that is, a modulator which samples at a rate well above the Nyquist rate. An A/D converter 104 and D/A converter 105 employed in modulator 112 may each be of single bit resolution (e.g., a simple comparator and a pair of switches coupling the comparator output to one or the other of two reference voltages, respectively), or may be multi-bit circuits. The following discussion of this circuit will assume the former, for purposes of conveying an understanding of the invention.

An analog input signal, oversampled at a high rate (e.g., greater than 16:1), is applied to input terminal 101 and is differentially summed with a feedback signal at summer 102. This summed signal is applied to an integrator 103. Because modulator 112 employs but a single integrator 103, the modulator operates as a first order modulator. The output signal of integrator 103 is converted to a multi-bit digital signal by A/D converter 104. This multi-bit digital signal is applied to a digital filter 106, and the output signal produced by filter 106 is decimated by a decimator 107 in order to match the desired sample rate at the decimator output 108. The A/D converter output signal is also applied to the input of D/A converter 105 which performs a reconversion to an analog signal that is ideally complementary to the operation of A/D converter 104. The reconverted analog signal is differentially summed with the input signal to derive the error signal which is integrated with the previous data sample and error values and converted to an updated digital value. This operation is repeatedly performed as long as the circuit is operating.

Figure 2:
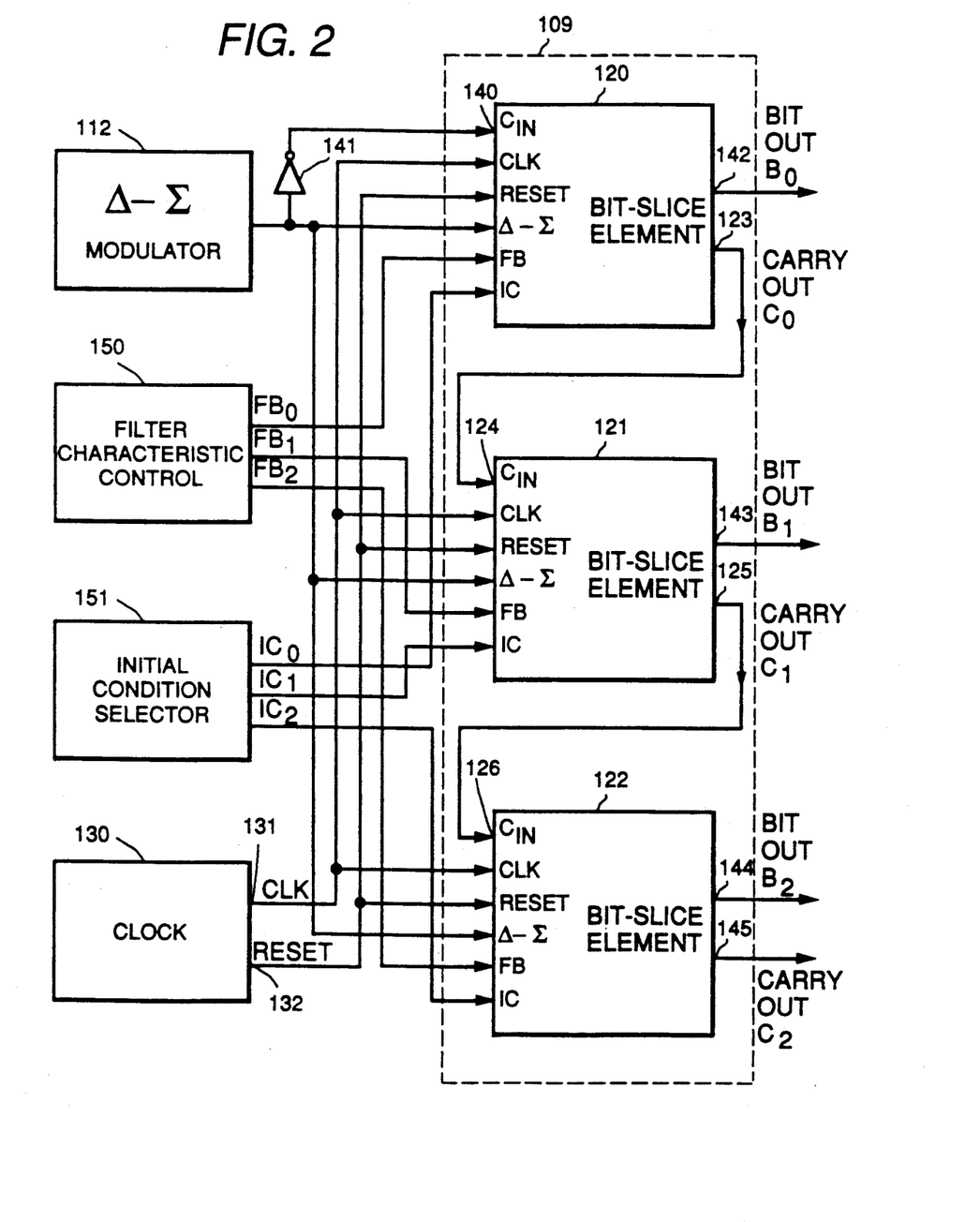
FIG. 2 is a block diagram of a cascade of three filter/decimator bit-slice elements according the present invention.

As shown in FIG. 2, a cascade of three bit-slice elements 120, 121, 122 is employed as a filter/decimator 109 for a 3-bit application. Intermediate bit-slice element 121 is inserted between first bit-slice element 120 and last bit-slice element 122 with the carry-bit $C_0$ output 123 of bit-slice element 120 serially coupled to the carry-bit input 124 of bit-slice element 121 and the carry-bit $C_1$ output 125 of bit-slice element 121 serially coupled to the carry-bit input of bit-slice element 122.

Bit-slice element 121 could be eliminated by coupling carry-bit output 123 directly to carry-bit input 126, so as to provide for a 2-bit application, but this, as well as the three-bit application, would be a trivial illustration of the principles of the invention. More importantly, extension to a larger number of bit-slice elements can easily be accomplished by inserting additional bit-slice elements (not shown) between the first bit-slice element 120 and the last bit-slice element 122, with carry-bit outputs coupled to carry-bit inputs in a manner similar to the coupling employed for intermediate bit-slice element 121.

Bit-slice elements 120, 121, 122 are connected in parallel with delta sigma modulator 112 to receive a digital bit-rate input. Each bit-slice element is coupled in parallel to a clock circuit 130 at terminal 131 to receive clock signals at the Nyquist rate and at terminal 132 to receive a reset signal that clears the bit-slice elements at the end of each computation. Preferably, carry-bit input 140 of the first bit-slice element 120 is coupled to delta sigma modulator 112 through an inverter 141 so that each respective bit-slice stage output 142, 143, 144 produces a separate respective single bit of a binary number in 2's complement form, and the last bit-slice element 112 of the cascade also produces a final carry-bit at an output 145.

A filter characteristic control 150 is coupled to each bit-slice element to provide a coefficient for the filter impulse response in the form of an arbitrary binary number corresponding to the desired filter characteristic for a particular application. Thus the circuit provides for variable filter characteristics dependent upon an input filter coefficient, without need for modifying the filter/decimator hardware.

For example, to provide a rectangular filter window, the coefficient bit $FB_0$ for the least significant bit-slice element 120 is set to a logical "1" and the other coefficient bits are set to logical "0", resulting in the circuit performing as a counter. For a triangular filter window, the coefficients are each in the form of a ramp (0, 1, 2, 3, ...), and they can be supplied from counter outputs. For more complicated coefficients, either a special coefficient generator may be used or a random access memory (RAM) or a read only memory (ROM) can supply the necessary coefficient bit inputs.

The invention is applicable only to Finite Impulse Response (FIR) filtering, and the coefficients are samples of the impulse response of the desired filter, supplied in reverse order. In this manner the $\Delta$-$\Sigma$ output bits are controlled with the FIR filter impulse response. For a further explanation, see A. V. Oppenheim and R. W. Schafer, *Digital Signal Processing*, Prentice-Hall International Inc. (1975), pp. 155-165, which is hereby incorporated by reference.

Optionally, initial condition selector 151 may be coupled to each bit-slice element to provide an initial condition value ($IC_0$, $IC_1$, $IC_2$ ...) in the cascade of bit-slice elements at the beginning of each computation. Initial conditions may be supplied by specialized hardware, or by access to a RAM or a ROM.

Figure 3:
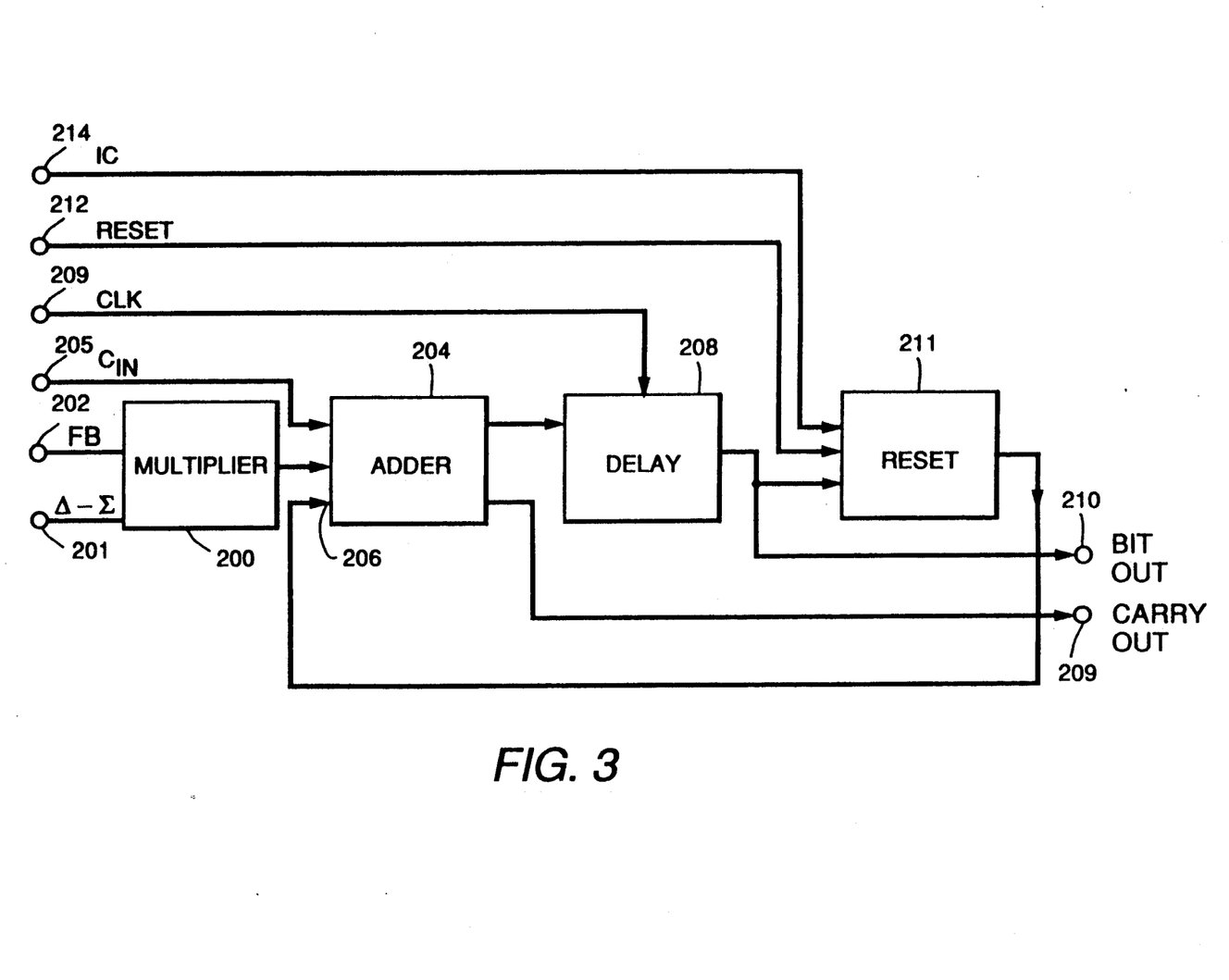
FIG. 3 is a functional block diagram of a bit-slice element within the filter/decimator according to the invention.

FIG. 3 is a functional block diagram of a single bit-slice element. In FIG. 3, a multiplier 200 is employed to perform a 1-bit by 1-bit multiplication of a delta sigma bit-rate input signal to multiplier input terminal 201 and a filter coefficient bit input signal to multiplier input terminal 202. The multiplication result is supplied to an adder 204 which accumulates the multiplication result with a carry-bit received at bit-slice element input terminal 205 and a previous accumulation received back from a reset circuit 211 at adder input 206. Adder 204 also determines the carry output signal for the accumulation which is directed to bit-slice element output terminal 209. The accumulation result from adder 204 is supplied to a delay 208 which is clocked by a clock cycle input signal from bit-slice element input terminal 209. The output signal of delay 208 is the accumulated sum of the previous clock cycle and is supplied to bit-slice element output terminal 210 and a reset circuit 211.

During computation, the previous accumulation is directed through reset circuit 211 and back to adder 204. At the end of each computation, a reset signal from clock circuit 130 (FIG. 2) is supplied from bit-slice element terminal 212 to reset circuit 211 which clears the accumulation from adder 204 for that bit-slice element. Optionally, at the end of a computation, an initial condition signal at bit-slice element input terminal 214 is furnished to reset circuit 211 to provide an initial accumulation condition for the bit-slice element.

The circuit thus operates to perform a multiply-accumulate function. During each clock cycle, depending on the input signal from the delta sigma modulator and the input signal from the filter characteristic control, a multiplication result is added to the previous accumulation until a reset signal is received to define the end of the computation.

Figure 4:
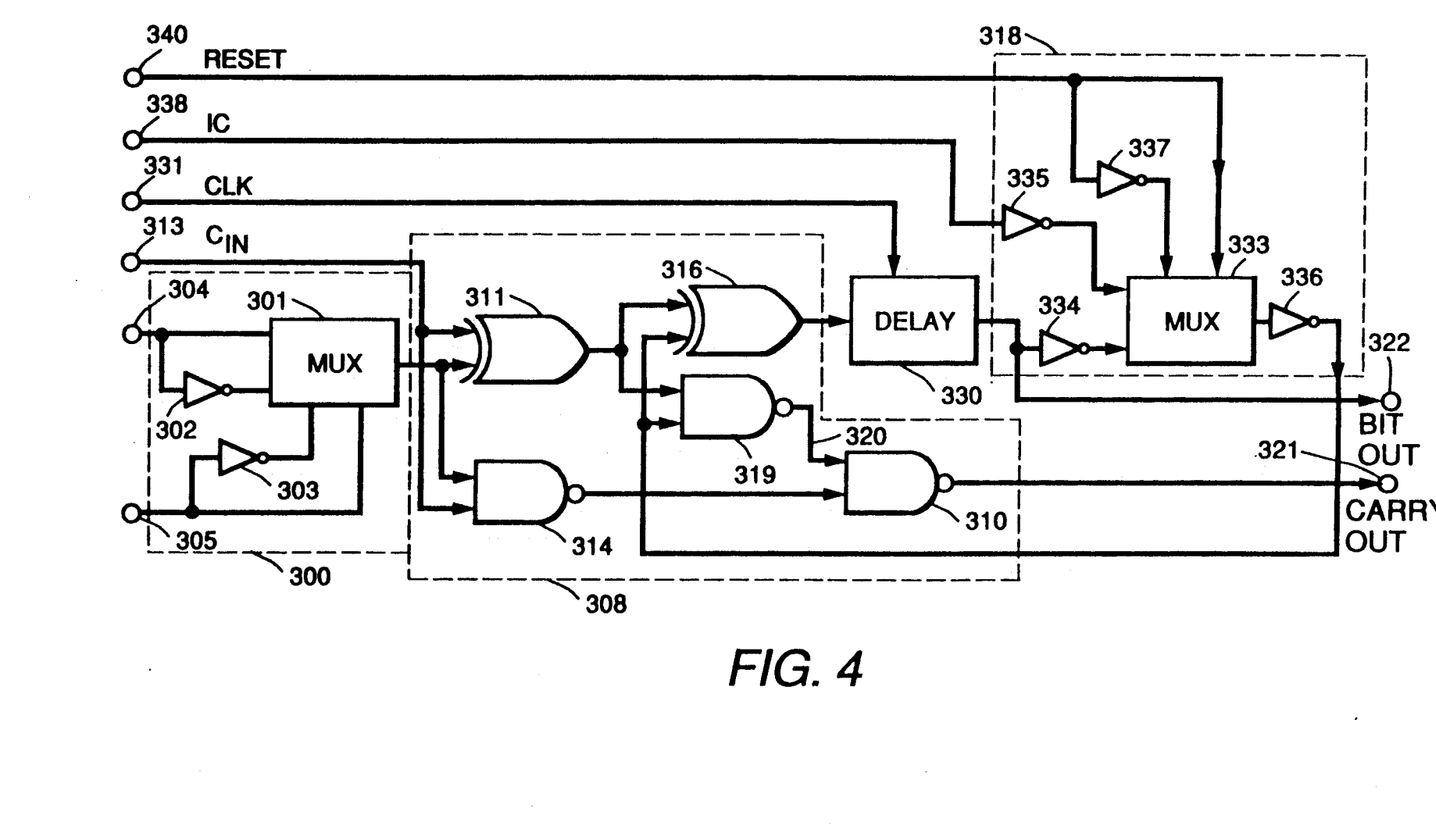
FIG. 4 is a block diagram of a first preferred embodiment of a bit-slice filter element according to the invention.

FIG. 4 is a detailed block diagram of a bit-slice element constituting a first preferred embodiment of the invention. In this embodiment, a multiplier circuit 300 is comprised of a multiplexer 302 and two inverters 302, 303. When a delta sigma bit-rate input signal to terminal 304 is high (i.e., a logical "1"), the filter coefficient control bit supplied to input terminal 305 is directed to an adder circuit 308. When the delta sigma modulator output signal is low (i.e., a logical "0"), multiplexer 301 directs the inverse or 1's complement of the filter coefficient bit to adder circuit 308. In actuality, multiplier 300 comprises an Exclusive NOR gate which performs a bipolar multiplication of its input signals; i.e., logical "1" may be considered to have the value +1 and logical "0" may be considered to have the value −1. The details of multiplier circuit 300 may be varied as any multiplier circuit could be used to implement the invention.

Adder 308 is a conventional full adder circuit comprised of a NAND gate 310 and a cascade of two identical half adders 311, 314 and 316, 319. In the first half adder, Exclusive OR gate 311 determines the sum of the result from multiplier circuit 300 and a carry signal from bit-slice element input terminal 313. Also, a NAND gate 314 determines the carry result of the addition of the first half adder. In the second half adder, an Exclusive OR gate 316 determines the accumulated sum by addition of a previous accumulation returned back from a reset circuit 318 and the sum output signal from the first half adder 311, 314. NAND gate 319 also determines the carry result of the second addition. NAND gate 310 combines the carry result of the first half adder 311, 314 and the carry result of the second half adder 316, 319 to determine the total carry result which is produced at output terminal 321 of the bit-slice element. The preferred full adder circuit, as shown, constitutes a simple design; however, any design for a full adder can be used to implement the invention.

Delay 330 preferably includes registers (not shown) which respond to clock cycle signals at one or more input terminals 331 of the bit-slice element. Delay 330 receives the sum from the second half adder circuit 316, 319 and produces the previous accumulation, which is equal to the value of the accumulated sum received from adder circuit 308 during the previous clock cycle. Terminal 331 may include several separate signal connections, as required, to control the delay registers in order to provide the delay function.

Reset circuit 318 in this embodiment comprises a multiplexer 333 and four inverters 334, 335, 336, 337. Inverter 334 directs the complement of the previous accumulation from delay 330 to multiplexer 333, inverter 335 directs the complement of initial conditions received at bit-slice element input terminal 338 to multiplexer 333, and inverter 336 directs the complement of the signal produced by multiplexer 333 back to adder circuit 308. During computation, the reset signal from bit-slice element input terminal 340 is inactive and inverter 337 directs the complement of the reset signal to multiplexer 333 which, in turn, directs the previous accumulation from delay 330 back to adder circuit 308. The end of each computation is defined by a reset signal at bit-slice element input terminal 340 (produced by clock means 130 in the system of FIG. 2), at which time multiplexer 333 directs the initial condition signal, which may be zero, from terminal 338 to adder circuit 308.

Figure 5:
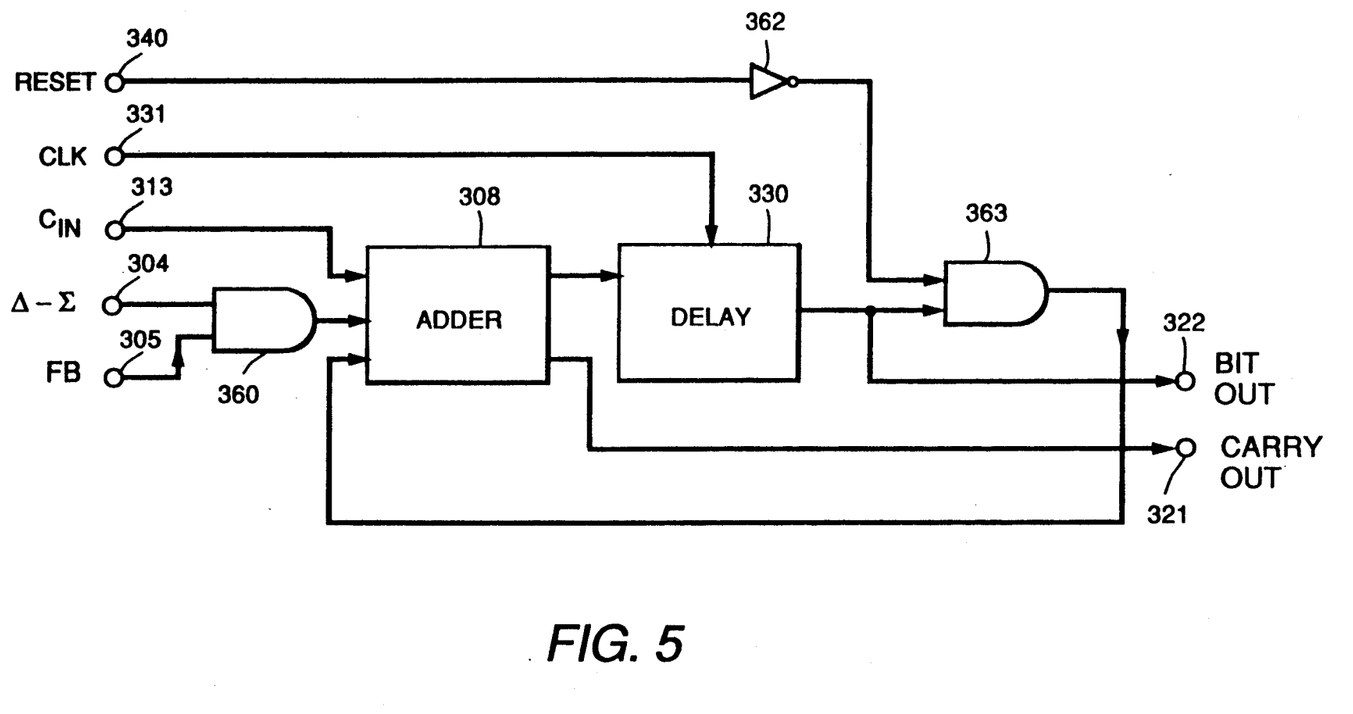
FIG. 5 is a block diagram illustrating an alternative embodiment of a bit-slice filter element according to the invention.

FIG. 5 shows an alternative embodiment of the bit-slice element of the invention which employs some of the apparatus used in the circuit of FIG. 4. Multiplexer 301 and inverters 302, 303 of the multiplier circuit of FIG. 4 are here replaced by an AND gate 360 which performs a unipolar multiplication of the delta sigma signal supplied to bit-slice element input terminal 304 and the filter coefficient control bit supplied to bit-slice element input terminal 305.

Multiplier 300 in the circuit of FIG. 4 treats logic values as bipolar bits, but the simpler multiplier circuit of FIG. 5, i.e., AND gate 360, treats logic values as unipolar bits. Thus, logic "0" has a value of zero. If, as is common, the FIR filter coefficients are positive numbers only and the Δ-Σ modulator operates on bipolar analog input signals, the final output signal of the decimator filter when multiplier 300 of FIG. 4 is employed will be a signed 2's complement representation of the analog input signal. When multiplier 360 of FIG. 5 is used, the decimator filter output signal is a unipolar binary representation of the input signal and, to convert this result to the desired 2's complement form, a number equal to half the full scale value must be subtracted; i.e., the most significant bit (MSB) must be inverted.

An adder 308 in the circuit of FIG. 5 may be any full adder such as the adder in the circuit of FIG. 4, and delay 330 in the circuit of FIG. 5 is responsive to clock cycle signals supplied to bit-slice element input terminal 331 as described in reference to FIG. 4.

The bit-slice element of FIG. 5 does not receive any initial condition input signal such as is supplied to input terminal 338 of the bit-slice element of FIG. 4. Therefore, multiplexer 333 and inverters 334, 335, and 337 of reset circuit 318 of FIG. 4 may be replaced by an inverter 362 and AND gate 363, as shown in FIG. 5, in order to simplify the circuit. Inverter 362 directs the complement of the reset signal from bit-slice element input terminal 340 to AND gate 363. During computation, AND gate 363 directs previous accumulation signals from delay 330 back to adder circuit 308. At the end of each computation, a reset signal is supplied to bit-slice element input terminal 340 so that AND gate 363 directs a zero initial condition to adder 308.

Either the simplification of the multiplier circuit or the simplification of the reset circuit, as described in reference to FIG. 5, or both, may be employed, depending upon the application in which the circuit is to be used.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

Having thus described our invention, what we claim as new and desire to secure by Letters Patent is as follows:

1. A digital filter/decimator for filtering a bit-rate signal from a delta sigma modulator, comprising:
    filter characteristic control means for selecting an arbitrary predetermined filter impulse response coefficient as a binary bit;
    clock means for generating clock signals defining a clock cycle and a computation cycle; and
    a plurality of bit-slice filter elements coupled in cascade and forming an accumulator for providing a binary output signal for said digital filter/decimator, each bit-slice element being responsive to said bit-rate signal and said binary bit from said filter characteristic control means, and each bit-slice element comprising:
        multiplier means for multiplying said bit-rate signal and a binary bit input signal from said filter characteristic control means;
        adder means for receiving a selected output signal from said multiplier means, a signal representing a previous accumulation result for said each bit-slice element, and a carry output signal from a preceding bit-slice element, for generating a carry output signal and an accumulation result output signal;
        delay means coupled to receive said accumulation output signal and responsive to said clock signals for delaying said accumulation result output signal by one clock cycle; and
        reset means responsive to said clock means for providing said previous accumulation result to said adder means and for clearing said accumulator and setting an initial condition upon termination of each computation cycle.

2. The filter/decimator of claim 1 wherein said multiplier means comprises a bipolar multiplier and said binary output signal is a signed 2's complement of an analog input signal to said delta sigma modulator.

3. The filter/decimator of claim 2 wherein, for each bit-slice element, said multiplier means comprises:
    an inverter responsive to said binary bit from said filter characteristic control means for generating an inverted coefficient bit; and
    a multiplexer responsive to said bit-rate signal for selecting either said binary bit or said inverted coefficient bit as an input signal to said adder means.

4. The filter/decimator of claim 1 wherein said multiplier means comprises a unipolar multiplier and said binary output signal is a unipolar binary representation of an analog input signal to said delta sigma modulator.

5. The filter/decimator of claim 4 wherein, for each bit-slice element, said multiplier means comprises an AND gate responsive to said binary bit from said filter characteristic control means and to said bit-rate signal.

6. The filter/decimator of claim 1 wherein, for each bit-slice element, said reset means comprises an AND gate responsive to said clock means for defining a calculation cycle in which either zero initial conditions or said accumulation result is provided as an output signal of said reset means.

7. The filter/decimator of claim 1 further comprising initial condition selector means for producing initial condition bits and wherein, for each bit-slice element, said reset means comprises a multiplexer responsive to said clock means for defining a calculation cycle in which either an initial condition bit from said initial condition selector means or said accumulation result is provided as an output signal of said reset means.

8. An analog-to-digital converter including a delta sigma modulator for receiving an analog input signal and producing a bit-rate signal, said delta sigma modulator comprising:
    differential summing means for subtracting a feedback analog signal from said analog input signal to produce a differential output signal;
    integration means for integrating said differential output signal;
    single bit analog-to-digital converter means for converting said integrated differential output signal to said bit-rate signal;
    single bit digital-to-analog converter means coupled to said single bit analog-to-digital converter means for converting said bit-rate signal to said feedback analog signal;
    a digital filter/decimator coupled to said single bit analog-to-digital converter means for filtering said bit-rate signal;
    filter characteristic control means for selecting an arbitrary predetermined filter impulse response coefficient as a binary bit;
    clock means for generating clock signals defining a clock cycle and a computation cycle; and
    a plurality of bit-slice filter elements coupled in cascade and forming an accumulator for providing a binary output signal for said digital filter/decimator, each bit-slice element being responsive to said bit-rate signal and said binary bit from said filter characteristic control means, and each bit-slice element comprising:
        multiplier means for multiplying said bit-rate signal and a binary bit input signal from said filter characteristic control means;
        adder means for receiving a selected output signal from said multiplier means, a signal representing a previous accumulation result for said each bit-slice element, and a carry output signal from a preceding bit-slice element, for generating a carry output signal and an accumulation result output signal;
        delay means coupled to receive said accumulation result output signal and responsive to said clock signals for delaying said accumulation result output signal by one clock cycle; and
        reset means responsive to said clock means for providing said previous accumulation result to said adder means and for clearing said accumulator and setting an initial condition upon termination of each computation cycle.

9. The analog-to-digital converter of claim 8 wherein said multiplier means comprises a bipolar multiplier and said binary output signal is a signed 2's complement of an analog input signal to said delta sigma modulator.

10. The analog-to-digital converter of claim 9 wherein, for each bit-slice element, said multiplier means comprises:
    an inverter responsive to said binary bit from said filter characteristic control means for generating an inverted coefficient bit; and
    a multiplexer responsive to said bit-rate signal for selecting either said binary bit or said inverted coefficient bit as an input signal to said adder means.

11. The analog-to-digital converter of claim 8 wherein said multiplier means comprises a unipolar multiplier and said binary output signal is a unipolar binary representation of an analog input signal to said delta sigma modulator.

12. The analog-to-digital converter of claim 11 wherein, for each bit-slice element, said multiplier means comprises an AND gate responsive to said binary bit from said filter characteristic control means and to said bit-rate signal.

13. The analog-to-digital converter of claim 8 wherein, for each bit-slice element, said reset means comprises an AND gate responsive to said clock means for defining a calculation cycle in which either zero initial conditions or said accumulation result is provided as an output signal of said reset means.

14. The analog-to-digital converter of claim 8 further comprising initial condition selector means for producing initial condition bits and wherein, for each bit-slice element, said reset means comprises a multiplexer responsive to said clock means for defining a calculation cycle in which either an initial condition bit from said initial condition selector means or said accumulation result is provided as an output signal of said reset means.

* * * * *